United States Patent
Kuhara et al.

(10) Patent No.: US 6,696,740 B2
(45) Date of Patent: Feb. 24, 2004

(54) PHOTODIODE

(75) Inventors: Yoshiki Kuhara, Osaka (JP); Yasuhiro Iguchi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/310,924

(22) Filed: Dec. 6, 2002

(65) Prior Publication Data

US 2003/0116818 A1 Jun. 26, 2003

Related U.S. Application Data

(62) Division of application No. 09/918,488, filed on Aug. 1, 2001, now Pat. No. 6,521,968.

(30) Foreign Application Priority Data

Aug. 1, 2000 (JP) ........................................ 2000/232832

(51) Int. Cl.[7] .............................................. H01L 31/06
(52) U.S. Cl. ...................................... 257/461; 257/460
(58) Field of Search ................................ 257/461, 431, 257/233, 462, 460, 437

(56) References Cited

U.S. PATENT DOCUMENTS

| | | | | |
|---|---|---|---|---|
| 4,906,583 A | * | 3/1990 | Kagawa et al. | 438/91 |
| 5,434,426 A | * | 7/1995 | Furuyama et al. | 250/551 |
| 5,991,322 A | * | 11/1999 | Takiguchi et al. | 372/50 |
| 6,005,276 A | * | 12/1999 | Forrest et al. | 257/432 |
| 6,043,550 A | * | 3/2000 | Kuhara et al. | 257/461 |
| 6,340,831 B1 | * | 1/2002 | Kuhara et al. | 257/461 |
| 6,489,659 B2 | * | 12/2002 | Chakrabarti et al. | 257/460 |
| 6,521,968 B2 | * | 2/2003 | Kuhara et al. | 257/461 |

FOREIGN PATENT DOCUMENTS

| | | |
|---|---|---|
| JP | 4-213876 | 8/1992 |
| JP | 9-166717 | 6/1997 |

* cited by examiner

*Primary Examiner*—Carl Whitehead, Jr.
*Assistant Examiner*—William Vesperman
(74) *Attorney, Agent, or Firm*—Smith, Gambrell & Russell

(57) ABSTRACT

A photodiode that is used in an optical communication system using two different wavelengths, $\lambda 1$ and $\lambda 2$ ($\lambda 1 < \lambda 2$), and that enables a reduction in the optical crosstalk caused by outgoing light having a longer wavelengths, $\lambda 2$. A photodiode that receives light having a shorter wavelengths, $\lambda 1$, is provided with an absorption layer made of a material having a bandgap wavelength, $\lambda.g.$ ($\lambda 1 < \lambda g < \lambda 2$), to detect the light having $\lambda 1$. A filter layer that absorbs unwanted light having $\lambda 2$ is provided over the absorption layer so that the light having $\lambda 2$ cannot return to the absorption layer after passing through it once.

3 Claims, 11 Drawing Sheets

Sensitivity characteristic of a conventional photodiode

Type 1

PHOTODIODE

The present application is a divisional of Ser. No. 09/918,488, filed Aug. 1, 2001, now U.S. Pat. No. 6,521,968 which prior application is incorporated herein by reference.

BACKGROUND OF THE INVENTION

1. Field of the Invention

The present invention relates to the structure of a photodiode used in an optical transceiver module for an optical communication system in which one optical fiber is used for carrying out transmission and reception of signals by using two different wavelengths, $\lambda 1$ and $\lambda 2$ ($\lambda 1 < \lambda 2$). The photodiode can detect light having a shorter wavelength, $\lambda 1$, by dexterously eliminating the influence of outgoing light having a longer wavelength, $\lambda 2$. It should be noted that the photodiode is for detecting light having a shorter wavelength, not for detecting light having a longer wavelength. To be blocked is the light having a longer wavelength, not the light having a shorter wavelength.

2. Description of Related Arts

When one optical fiber is used for both transmission and reception of signals, a laser diode (LD), which emits outgoing light, and a photodiode (PD), which receives incoming light, are placed usually in the same housing or on the same platform. Similarly, when one optical fiber is used for transmitting signals uni-directionally by using two or more different wavelengths, two or more PDs are placed usually on the same platform. A PD is a device having high sensitivity. An LD emits intense outgoing light to transfer signals to a distant place. Although the PD and LD act at different wavelengths, the PD has sensitivity to the outgoing light and detects it. When an LD and a PD are placed on the same terminal, if the PD detects the outgoing light emitted by the LD, this phenomenon is called optical crosstalk. The outgoing light acts as noise for the PD. When the PD detects the outgoing light, incoming light cannot be detected accurately. Therefore, it is necessary to minimize the crosstalk between the PD and LD. Undoubtedly, there can be electrical crosstalk between a transmitter and a receiver caused by the magnetic coupling between their electric circuits. However, to be solved here is the problem of optical crosstalk.

Researchers and engineers have devised various types of transceivers that carry out transmission and reception of signals over one optical fiber. Those transceivers employ different methods for separating the outgoing light and incoming light. The most popular method uses an optical wavelength demultiplexer to branch the path for the outgoing light and the path for the incoming light. Such a method in which the two paths are separated spatially can solve the problem of optical crosstalk relatively easily. There is a rather special transceiver module in which a PD and an LD are arranged in a straight line. Such a method in which almost the same path is used for both transmission and reception makes it difficult to solve the problem of optical crosstalk.

FIG. 1 shows a system of simultaneous bidirectional optical communication in which one optical fiber connects a central office and a subscriber for carrying out bidirectional signal transmission by using two different wavelengths, $\lambda 1$ and $\lambda 2$. This is a system of wavelength division multiplexing (WDM) bidirectional communication. A central office generates a signal using LD1 and sends it to PD2 at a subscriber via an optical fiber 1, an optical wavelength demultiplexer 2, an optical fiber 3, an optical wavelength demultiplexer 4, and an optical fiber 5. The subscriber generates another signal using LD2 and sends it to PD1 at the central office via an optical fiber 6, the optical wavelength demultiplexer 4, the optical fiber 3, the optical wavelength demultiplexer 2, and an optical fiber 7. Thus, signals can be transmitted in opposite directions at the same time over one optical fiber.

At the central office, the optical wavelength demultiplexer 2 is connected to the optical fibers 7 and 1 to separate an upstream signal and a downstream signal according to their wavelengths. The outgoing light carrying downstream signals has the wavelength $\lambda 2$ and the incoming light carrying upstream signals has the wavelength $\lambda 1$. The downstream and upstream signals travel over the one optical fiber 3 at the same time.

At the subscriber, the optical wavelength demultiplexer 4 is connected to the optical fibers 5 and 6 to separate incoming light and outgoing light. The photodiode PD2 receives incoming light having the wavelength $\lambda 2$, and LD2 generates outgoing light having the wavelength $\lambda 1$. Although not shown, there are individual electric circuits beyond PD2 and LD2.

The present invention addresses problems related to a transceiver at a central office. Problems at a central office are different from those at a subscriber because the aspect related to wavelength is reversed In the example shown in FIG. 1, the optical wavelength demultiplexers 2 and 4 spatially separate the optical paths of the outgoing light and the incoming light. Therefore, the problem of optical crosstalk can be solved by the improvement of the performance of the optical wavelength demultiplexer, for example. The problem to be solved by the present invention is the optical crosstalk between the PD and LD at a central office.

FIG. 2 shows another system in which two signals are transmitted unidirectionally from a central office to a subscriber by using different wavelengths, $\lambda 1$ and $\lambda 2$. This is a system of WDM unidirectional communication. A central office generates two signals by using two different LDs. They are combined at an optical wavelength multiplexer 8 and transmitted from the central office to a subscriber over one optical fiber. At the subscriber, the two signals are separated according to their wavelengths by an optical wavelength demultiplexer 4. The photodiodes PD1 and PD2 selectively receive the signals. Here, crosstalk between PD1 and PD2 also poses a problem.

FIG. 3 shows a typical example of a conventional PD module used as a receiver in an optical communication system in which the optical paths are separated as shown in FIGS. 1 and 2. This type of PD module is still mainly used. Lead pins 9 are provided at a circular metal stem 10, at the center of which a submount 11 supports a PD chip 12. A lens 13 is attached to a cylindrical cap 14 welded to the stem 10 in alignment. A cylindrical sleeve 15 is placed on the cap. A ferrule 16 is inserted into the mandrel hole of the sleeve 15. The ferrule 16 supports the end of an optical fiber 17. The tip of the ferrule 16 is polished on the skew. The sleeve 15 is covered with a bend limiter 18 to protect the optical fiber 17. This explains the structure of a PD module currently in use. The systems shown in FIGS. 1 and 2 also include LD modules. In an LD module, only the PD shown in FIG. 3 is replaced by an LD. Therefore, an LD module has a structure similar to that of a PD module, and no explanation about it is provided here. PD modules and LD modules now in use employ a metal case, so that optical fibers are arranged stereoscopically (three-dimensionally). Although high in performance, those modules require centering work at the time of assembly. The centering is a time-consuming job and increases the manufacturing cost. Because of the high price, those modules are not suitable in achieving widespread application.

Researchers and engineers have been energetically studying surface-mounted types for use as less costly PD modules, LD modules, or PD-LD modules. FIG. 4 shows an example of a conventional surface-mounted-type module that uses a back-illuminated-type PD. A rectangular silicon platform 19 is provided with a longitudinal, V-shaped groove 20 at the center. The groove is formed by etching. A slanted mirror face 21 is provided at the end of the V-shaped groove 20. The etching work simultaneously forms the mirror face 21 also. A PD chip 23 is fixed directly above the end portion of the V-shaped groove 20. The PD chip 23, a back-illuminated-type PD, is provided with a photo-sensitive area 24 at the upper zone. The light emerging from an optical fiber 22 propagates in the V-shaped groove 20 in parallel with the surface of the silicon platform, is reflected upward by the mirror face 21, enters the PD 23 at the back side, and reaches the photo-sensitive area 24. A surface-mounted-type module has no centering portion. Elimination of centering work accomplishes easy manufacturing.

Both the PD modules shown in FIGS. 3 and 4 can be used for detecting the incoming light separated by the optical wavelength demultiplexers shown in FIGS. 1 and 2. An optical wavelength demultiplexer can be produced, for example, by forming a wavelength-selective branching waveguide on a silicon platform. There is also a prism-type optical wavelength demultiplexer as shown in FIG. 5. A dielectric multilayer film 27 is deposited on the oblique face of transparent triangular-column glass blocks 25 and 26 for wavelength selectivity. For example, when light emerges from an optical fiber 28, the light having a specific wavelength is reflected and the other light having a different wavelength is transmitted In FIG. 5, however, the wavelength selectivity is used for distinguishing the outgoing light from the incoming light. More specifically, the incoming light (wavelength: $\lambda 2$) emerging from the optical fiber 28 is reflected by the multilayer film 27 and introduced into a PD 30. The outgoing light (wavelength: $\lambda 1$) emitted from an LD 29 passes through the multilayer film 27 and enters the optical fiber 28.

However, the present invention whose intention is to minimize the optical crosstalk can be most suitably applied to a transceiver module in which the optical paths are not separated by an optical wavelength demultiplexer. Such a module is called an optical path non-separated type in the present invention in order to distinguish from the foregoing optical path-separated type. In the optical path non-separated type, a PD is placed at the side of the optical fiber and an LD is placed in line with the optical fiber. This type requires no optical wavelength demultiplexer. This is advantageous because the size becomes smaller and the structure becomes simpler. On the other hand, this type has a common optical axis for outgoing light and incoming light. As a result, the problem of optical crosstalk becomes more serious.

FIG. 6 shows an example of an optical path non-separated type for a module at a subscriber. The wavelengths of the outgoing light and incoming light are opposite to those at a central office. Although not shown, there is a silicon platform in a housing 31. An optical fiber 32 is housed longitudinally. An LD 33 is mounted opposite to the end of the optical fiber 32. A WDM filter 35 is provided at some point in the optical fiber 32 near its end to carry out wavelength distinction. A PD 34 is placed directly above the WDM filter 35. The outgoing light (wavelength: $\lambda 1$) emitted by the LD 33 is as powerful as 1 mW, for example. The outgoing light propagates to the outside through the optical fiber 32. The incoming light (wavelength: $\lambda 2$) having propagated through the optical fiber 32 from the outside is reflected by the WDM filter 35, enters the PD 34 at the back side, and is detected by a photo-sensitive area 36. Whereas the outgoing light is intense, the incoming light is weak. The outgoing light propagates to the WDM filter 35 through the same optical fiber 32 in the direction opposite to the incoming light. When passing through the WDM filter, part of the outgoing light may enter the PD. This intruding light causes the optical crosstalk. Notwithstanding the small percentage, the intruding light becomes an un-ignorable noise in comparison with the intensity of the incoming light, because the outgoing light is intense and the incoming light is weak.

FIG. 7 shows a conventional PD that has a wide range of sensitivity. When this type of PD is used, the problem of optical crosstalk becomes more serious. The structure of the InP-based PD shown in FIG. 7 is based on an epitaxial wafer in which an n-InP buffer layer 38, an n-InGaAs absorption layer 39, and an n-InP cap layer 40 are laminated on an n-InP substrate 37. At the upper zone of the PD, a p-type region 41 and a p electrode passivation layer 44 are formed. On the bottom surface, a ring-shaped n electrode 45 and an anti-reflection layer 46 are provided. When such a PD is used as a photodetector, the level of the noise caused by the outgoing light becomes higher than the signal level of the incoming light. In other words, the signal/noise ratio (S/N ratio) becomes smaller than one. When an ordinary PD, which has sensitivity to both $\lambda 2$ and $\lambda 1$, is used, the foregoing undesirable phenomenon occurs.

FIG. 8 is a graph showing the sensitivity characteristics of the PD shown in FIG. 7. The P portion in the shorter wavelength region, in which the sensitivity decreases with decreasing wavelength, corresponds to the bandgap of the InP substrate. The light having a shorter wavelength than that corresponding to the bandgap is not detected because it is absorbed by the InP substrate. The R portion in the longer wavelength region, in which the sensitivity decreases with increasing wavelength, corresponds to the bandgap of the InGaAs absorption layer. The Light having a longer wavelength than that corresponding to the bandgap is not detected because its energy is lower than the bandgap of the absorption layer. In other words, the PD has sensitivity in a wide range of Q from the bandgap wavelength P of the InP substrate to the bandgap wavelength R of the InGaAs absorption layer. Therefore, the PD has sufficient sensitivity not only at the 1.3-$\mu$m band but also at the 1.55-$\mu$m band.

As described above, the PD having a conventional structure as shown in FIG. 7 has sensitivity in a wide range of 1.0 to 1.65 $\mu$m as shown in FIG. 8. It is advantageous to have sensitivity in a wide range as above because the same PD can be used for both the 1.3-$\mu$m band and 1.55-$\mu$m band. Therefore, the PD having a structure as shown in FIG. 7 is most widely used for the long-wavelength light employed in optical communications. However, when the PD is used for a transceiver module, the PD also detects the outgoing light in addition to the incoming light, which means that the outgoing light acts as noise. Consequently, the PD is disadvantageous in that optical crosstalk occurs between the outgoing light and incoming light.

In the transceiver module shown in FIG. 6, not all the intense outgoing light (wavelength: $\lambda 1$) emitted from the LD placed on the silicon platform (silicon bench) enters the optical fiber. The light emitted from the LD spreads out at a considerably wide angle. Some of the light strikes the silicon platform and plastics to be scattered. The silicon platform is transparent to the outgoing light. The outgoing light having entered the space made by the silicon platform and transparent plastics passes through the silicon, is reflected, and is scattered Various complicated scattered rays of light are produced according to the distribution of the plastics, the shape of the silicon platform, and the arrangement of the other devices. When looked from the PD, the entire silicon platform shines brightly due to the scattering of the outgoing light. Such components of the outgoing light that enter the PD through various paths other than the designed path are called "scattered light" or "stray light."

Some components of the outgoing light enter the PD from various directions and at various heights. They enter the PD at the back side, at the front side, and at the side face. Such components of the outgoing light that enter the PD without entering the optical fiber cause the crosstalk. Such crosstalk caused by the scattered light (stray light) that does not pass through the WDM filter cannot be suppressed by the improvement of the performance of the WDM filter. When the output power of the LD is increased, the outgoing light propagating through the optical fiber increases the amount of the leakage at the WDM filter. The component of the outgoing light emitted from the LD that enters the PD after being refracted and reflected at the WDM filter is called "leakage light."

The unexamined Japanese patent publication (Tokukaihei) No.4-213876 entitled "Photodetector" proposes a photodetector that is a PD comprising two stages of absorption layers. A layer structure that absorbs 1.55-μm light is provided on an InP substrate and a p electrode is provided on the layer structure. On part of the layer structure, another layer structure that absorbs 1.3-μm light is provided and another p electrode is provided on this layer structure. A common n electrode is provided on the bottom surface of the InP substrate. Consequently, the photodetector has a two-stage structure in which PD1 for absorbing the light having λ1 (1.3 μm) is placed at the top and PD2 for absorbing the light having λ2 (1.55 μm) is placed at the bottom.

The light having λ2 and the light having λ1 enter the photodetector at the front side. Since the light having λ2 has a longer wavelength, it passes through the upper layer structure and reaches the lower layer structure to generate optical current there. In other words, PD2 absorbs the light having λ2 at the bottom. The light having λ1, which is shorter, is absorbed by PD1 in the upper structure to generate optical current there. In other words, PD1 can detect the light having λ1 at the top. In order to prevent the penetration of the light having λ1 into the lower structure, a layer having a thickness of $d=m\lambda 1/(2n)$, where m is a plus integer and n is a refractive index, is provided between PD1 and PD2. The object of this layer is to reflect the light having λ1 upward so that the light having λ1 cannot enter PD2. Hence, this layer is called a "selective reflection layer." If the light having λ1 enters PD2, the light causes PD2 to generate optical current, so that crosstalk occurs. The selective reflection layer is provided to prevent this type of crosstalk.

However, this patent application provides no preventive measure against crosstalk in the opposite case. Such a case is out of its expectations. There is no measure against the phenomenon that the light having λ2 is reflected by the n electrode at the bottom, returns to PD1, and adversely affects its performance. Since the selective reflection layer provided between PD1 and PD2 reflects the light having λ1 but transmits the light having λ2, the light having λ2 reflected at the bottom face can pass through the layer upward.

Another unexamined Japanese patent publication, (Tokukaihei) No.9-166717, entitled "Optical receiver module and optical transceiver module" proposes a photodetector for a system in which two signals having different wavelengths, λ1=1.3 μm and λ2=1.55 μm, are transmitted through one optical fiber. A first photodiode, PD1, absorbs the light having λ1 and transmits the light having λ2. A second photodiode, PD2, placed behind PD1, absorbs the light having λ2. Two independent PDs are combined in tandem. They are not such composite devices as described above. The photodiode PD1 has an absorption layer that has an intermediate bandgap wavelength as expressed in $\lambda 1<\lambda g<\lambda 2$, where λg represents the bandgap wavelength of the absorption layer. Since λg is longer than λ1, the absorption layer absorbs and detects the light having λ1. The light having λ2 passes through PD1 and is detected by PD2. FIG. 9 shows the structure of the PD for absorbing the light having λ1 proposed by Tokukaihei No.9-166717. The PD is placed in an intermediate place to transmit the light having the longer wavelength. For this purpose, the PD has another opening at the side opposite to the light-entering face to allow the light having the longer wavelength to leave the PD. The PD can be called a dual opening type, because it has openings at both sides for transmitting light.

An n-InP buffer layer 51, an n-InGaAsP absorption layer 52 (λg=1.42 μm), and an n-InGaAsP window layer 53 are grown epitaxially on an n-IP substrate 50. At the center portion, Zn is diffused to provide a p-type region 54. The center portion of the p-type region 54 is covered by an anti-reflection layer 56. Around the anti-reflection layer 56, a ring-shaped p electrode 55 is provided At the outside of the p electrode 55, a passivation layer 57 is formed to protect the edge portion of the pn junction. A ring-shaped n electrode 58 is formed on the bottom surface of the InP substrate 50. The inside of the n electrode 58 forms an opening and is covered by an anti-reflection layer 59. Both the front and back sides have openings for transmitting light. The ring-shaped electrodes are provided without overlapping with these openings. The anti-reflection layers are provided at the openings to prevent incident light from attenuating due to reflection.

FIG. 10 shows a transmittance spectrum of the InGaAsP absorption layer 52 (λg=1.42 μm). The mixing ratio of its quaternary mixed crystal is decided for the bandgap wavelength to take an intermediate value between 1.3 μm and 1.55 μm. The measured restart proves the design concept. The light having a wavelength shorter than 1.4 μm is absorbed almost completely, which means that the light practically does not pass through the layer. A wavelength of 1.42 μm forms the boundary condition. Almost one hundred percent of the light having a wavelength longer than 1.5 μm passes through the absorption layer. The transmittance varies with the thickness. The absorption layer has an enough thickness so that the light having a shorter wavelength can be absorbed completely.

The present invention intends to prevent a PD that detects the light having a shorter wavelength from suffering the crosstalk caused by the light having a longer wavelength. In the explanation below, the shorter wavelength, λ1, is supposed to be 1.3 μm and the longer wavelength, λ2, to be 1.55 μm in order to specifically show the relation between the two wavelengths. In the present invention, however, λ1 is in the range of 1.2 to 1.38 μm, and λ2 is in the range of 1.45 to 1.65 μm. At a central office, if a PD as shown in FIG. 7, which usually has sensitivity in a wide range, is used as a photodetector, it also detects the scattered light and leakage light of the outgoing light. At a central office, the incoming light has a wavelength of 1.3 μm, and the outgoing light, 1.55 μm. This combination of wavelengths is advantageous in eliminating the effect of the outgoing light. Dexterous exploitation of the basic properties of the semiconductor enables the production of a PD for a central office that detects the incoming light ($\lambda 1=1.3$ μm) but does not detect the outgoing light ($\lambda 2=1.55$ μm). This can be accomplished by selecting the bandgap wavelength $\lambda g$ of the absorption layer of the PD to satisfy the following formula:

$$\lambda 1 \text{(incoming light)} < \lambda g < \lambda 2 \text{(outgoing light)}.$$

This is possible because the two wavelengths at a central office have such an advantageous relationship. If the bandgap wavelength $\lambda g$ of the absorption layer is decided to be 1.35 to 1.45 μm, for example, then the absorption layer should have a desirable quality that it detects the incoming light but does not detect the outgoing light. A bandgap wavelength can be adjusted to 1.35 to 1.45 μm by using a quaternary mixed crystal of InGaAsP. In the present invention, however, $\lambda g$ is in the range of 1.3 to 1.5 μm.

FIG. 10 shows a light transmittance of an InGaAsP quaternary mixed-crystal layer having a bandgap wavelength of 1.42 μm. The absorption layer of the PD shown in FIG. 9 is made of such a mixed-crystal. Its transmittance is zero for 1.3-μm light (incoming light). In other words, it absorbs and detects 1.3-μm light completely. On the other hand, its transmittance is almost one hundred percent for 1.55-μm light (outgoing light). In other words, it transmits 1.55-μm light almost completely, which means it does not detect 1.55-μm light. Therefore, a PD as shown in FIG. 9, which has wavelength selectivity, can be used singly as a photodetector at a central office. The PD shown in FIG. 9 has an opening both at the front and back sides, because behind the PD another PD for detecting 1.55-μm light is to be placed. However, when a PD is used at a central office, only one opening is required because the PD has only to absorb 1.3-μm light. If the PD is a back-illuminated type, the front side is covered by the p electrode. If the PD is a front-illuminated type, the back side is covered entirely by the n electrode. Such a PD can be used as a photodetector at a central office without modification.

FIG. 11 shows a back-illuminated type PD conceived on the basis of the above-described consideration for the use in a central office. Although the PD is almost the same as that shown in FIG. 9, it has a slightly different structure in the vicinity of the p electrode. An n-InP buffer layer 61, an n-InGaAsP absorption layer 62 ($\lambda g=1.42$ μm), and an n-InP cap layer 63 are grown epitaxially on an n-InP substrate 60. At the center portion of the chip, Zn is diffused to provide a p-type region 64. A p electrode 65 having no opening is provided to cover almost the entire p-type region 64. Since the front side is not required to admit light, no opening is provided there. At the outside of the p electrode 65, a passivation layer 67 is formed to protect the edge of the pn junction. Since light enters the PD at the back side, the back-side structure is the same as in FIG. 9. A ring-shaped n electrode 68 is formed on the bottom surface of the InP substrate 60. The inside of the n electrode 68 forms an opening for admitting light and is covered by an anti-reflection layer 69. The ring-shaped electrode is provided without overlapping with the opening.

It should be possible to use a PD having such a structure as a photodetector at a central office. Nevertheless, the present inventors found that when such a PD is used as a photodetector at a central office, crosstalk occurs due to the influence of 1.55-μm light (outgoing light at the central office). It was out of the present inventors' expectations. The InGaAsP absorption layer 62 has a bandgap wavelength of 1.42 μm. Since it is shorter than 1.55 μm, the present inventors expected the absorption layer to be insensitive to 1.55-μm light as an ideal case. However, the result showed differently. The present inventors found that when the absorption layer 62 has a thickness of 5 μm, it detects about 0.2% of 1.55-μm light. The absorption layer absorbs 100% of 1.3-μm light. The fact that the absorption layer detects 1.55-μm light even in small magnitudes poses a problem. Although 1.55-μm light has an energy lower than the bandgap energy, there are some impurity levels in the bandgap, and these levels effect the slight sensitivity to 1.55-μm light. At a central office, there is imbalance in intensity of light. Whereas the 1.55-μm outgoing light generated in the office is intense, the 1.3-μm incoming light having propagated over an optical fiber is weak. The 1.55-μm outgoing light is more intense than the 1.3-μm incoming light by orders of magnitude. Therefore, even the 0.2% sensitivity can produce an un-ignorable magnitude in noise level because the multiplier has a considerable magnitude.

SUMMARY OF THE INVENTION

An object of the present invention is to offer a photodiode in which crosstalk caused by the intrusion of intense 1.55-μm outgoing light into the 1.3-μm-light detection portion at a central office can be reduced. This reduction in crosstalk can be accomplished by devising the configuration of the photodiode.

The present invention intends to reduce the crosstalk caused by 1.55-μm light by preventing or impeding the return of the outgoing light ($\lambda 2=1.55$ μm) to the absorption layer after passing through the absorption layer once. In order to achieve this purpose, a layer for absorbing 1.55-μm light is additionally provided at the inside or at the outside of a PD. In the present invention, this additionally provided absorption layer is called a "filter layer." Since these filter layers absorb unwanted 1.55-μm light, the light does not return to the absorption layer for 1.3-μm light, or its intensity is notably reduced even if it returns. This measure can effectively reduce the crosstalk to the 1.3-μm light by the 1.55-μm light predominant at a central office. The methods for providing filter layer for absorbing the 1.55-μm light include the following four types:

Type 1: To replace the InP cap layer by a thick InGaAs cap layer;

Type 2: To provide an InGaAs filter layer by epitaxial growth and remove its peripheral region;

Type 3: To laminate an InGaAs filter layer on the p-type region by the selective growing method; and Type 4: To laminate a filter layer made of a plastic resin or another material on the entire top surface of a chip.

When a material that absorbs 1.55-μm light is provided on the p-type region as mentioned above, the 1.55-μm light (outgoing light) that has once passed through the p-type region does not return to the absorption layer, or it loses its intensity notably even if it returns. The methods are not limited to the above-mentioned four types providing that a newly conceived method can achieve a similar effect.

DETAILED DESCRIPTION OF THE INVENTION

The present invention features a back-illuminated-type PD that has on the p-type region a layer made of a material that absorbs light having λ2 for preventing the return of the light after reflection so that the light cannot pass through the absorption layer twice. Although this PD does not prevent the first passage of light having λ2 through the absorption layer, it can prevent the second passage. This concept is realized through the process described below.

Figure 1:
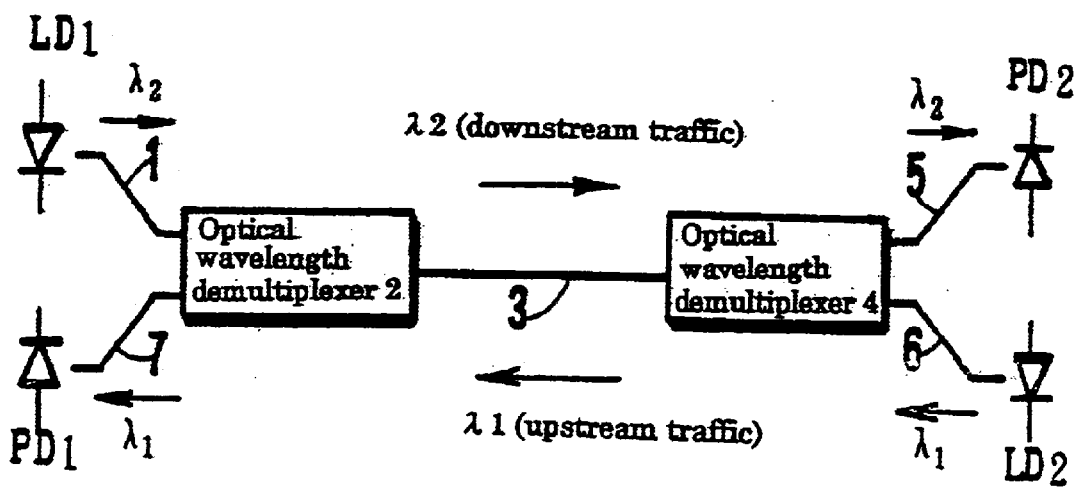
FIG. 1 is a schematic diagram showing a system of simultaneous bidirectional optical communication in which one optical fiber connects a central office and a subscriber for carrying out bidirectional signal transmission by using two different wavelength, $\lambda 1$ and $\lambda 2$.
Figure 2:
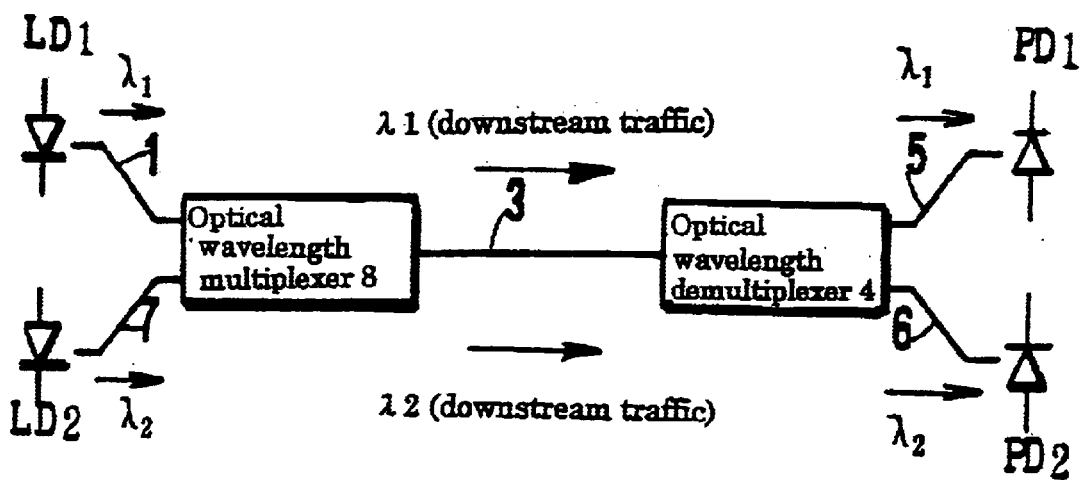
FIG. 2 is a schematic diagram showing a system of simultaneous unidirectional optical communication in which one optical fiber connects a central office and a subscriber for carrying out unidirectional signal transmission by using two different wavelength, λ1 and λ2.
Figure 3:
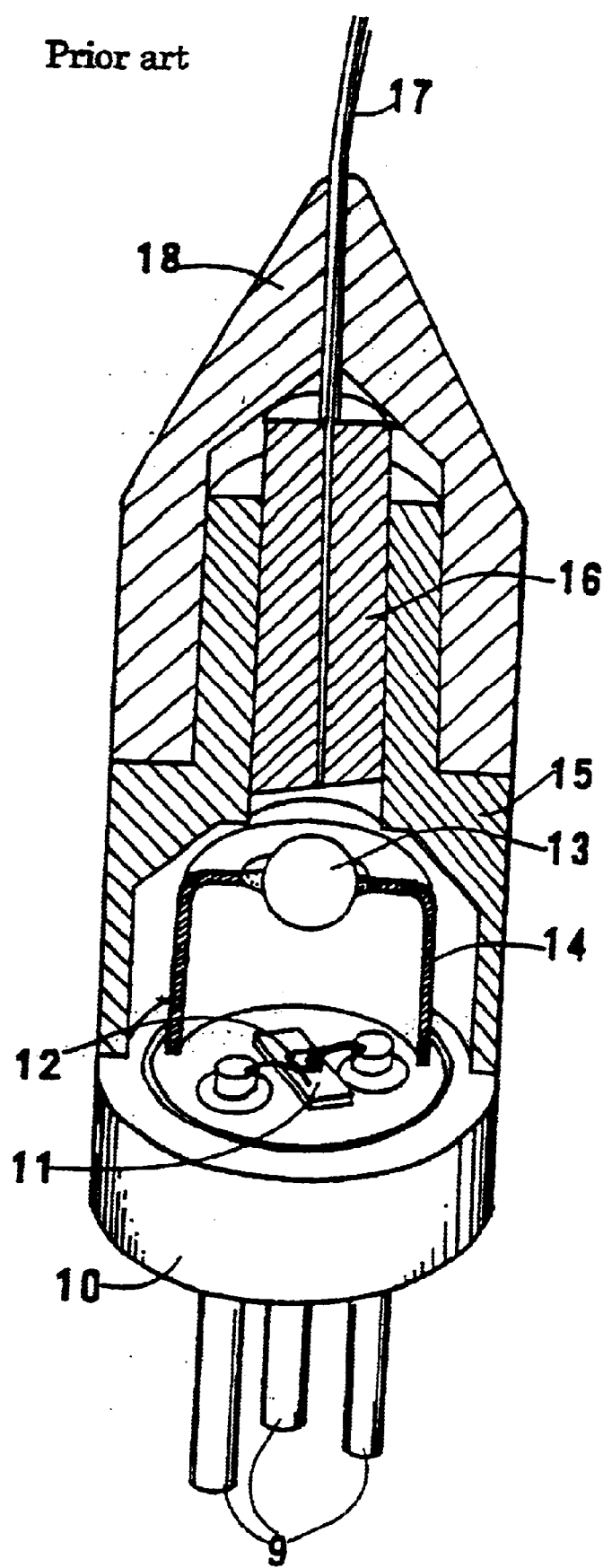
FIG. 3 is a partial cutaway and partial cross-sectional view of a conventional PD that is housed in a metal housing and that has a three-dimensional structure.
Figure 4:
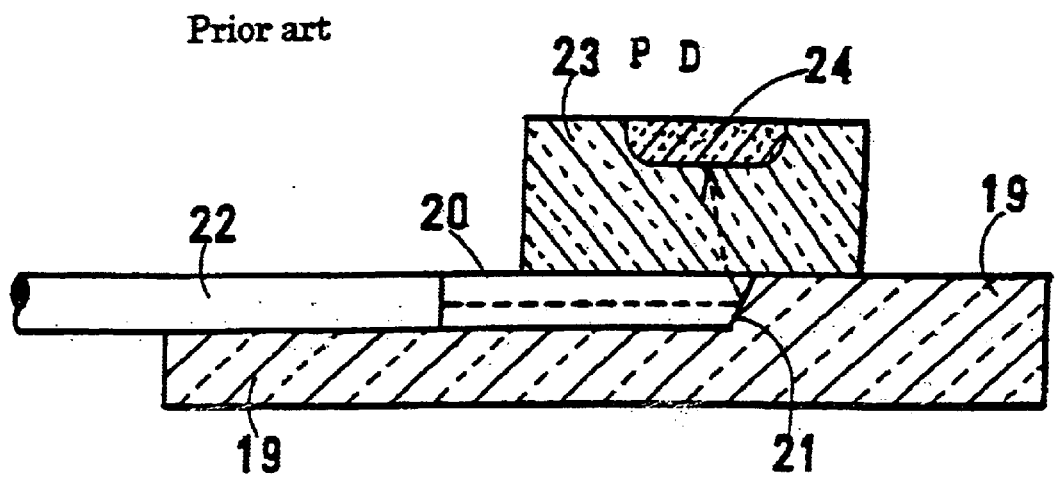
FIG. 4 is a cross-sectional view of a conventional surface-mounted-type PD module.
Figure 5:
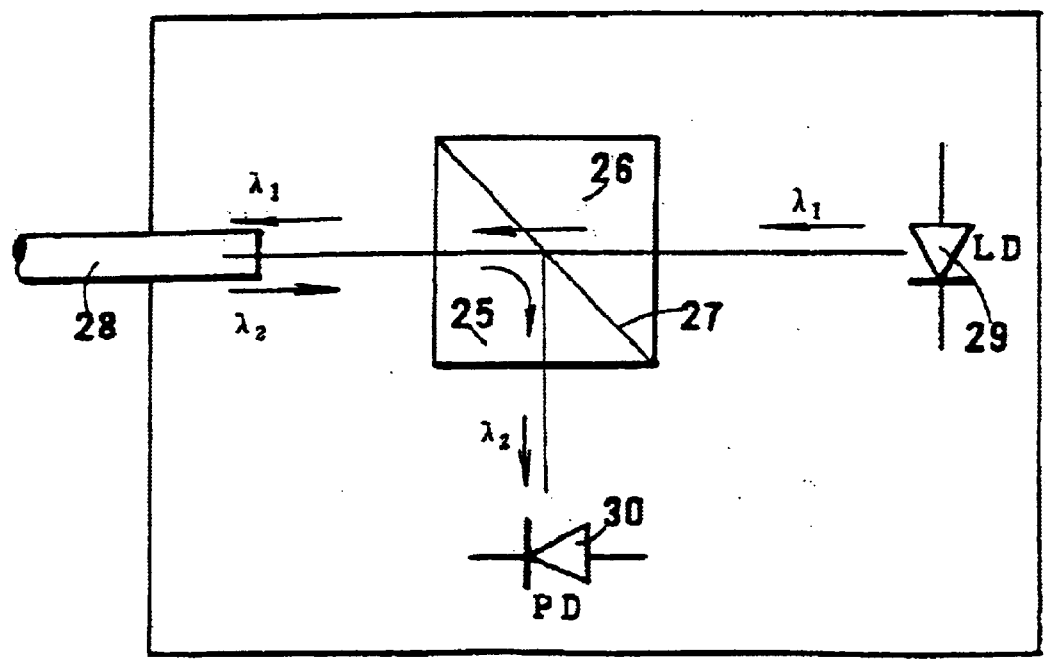
FIG. 5 is a schematic diagram showing the constitution of a prism-type optical wavelength demultiplexer comprising glass blocks provided with a dielectric multilayer film.
Figure 6:
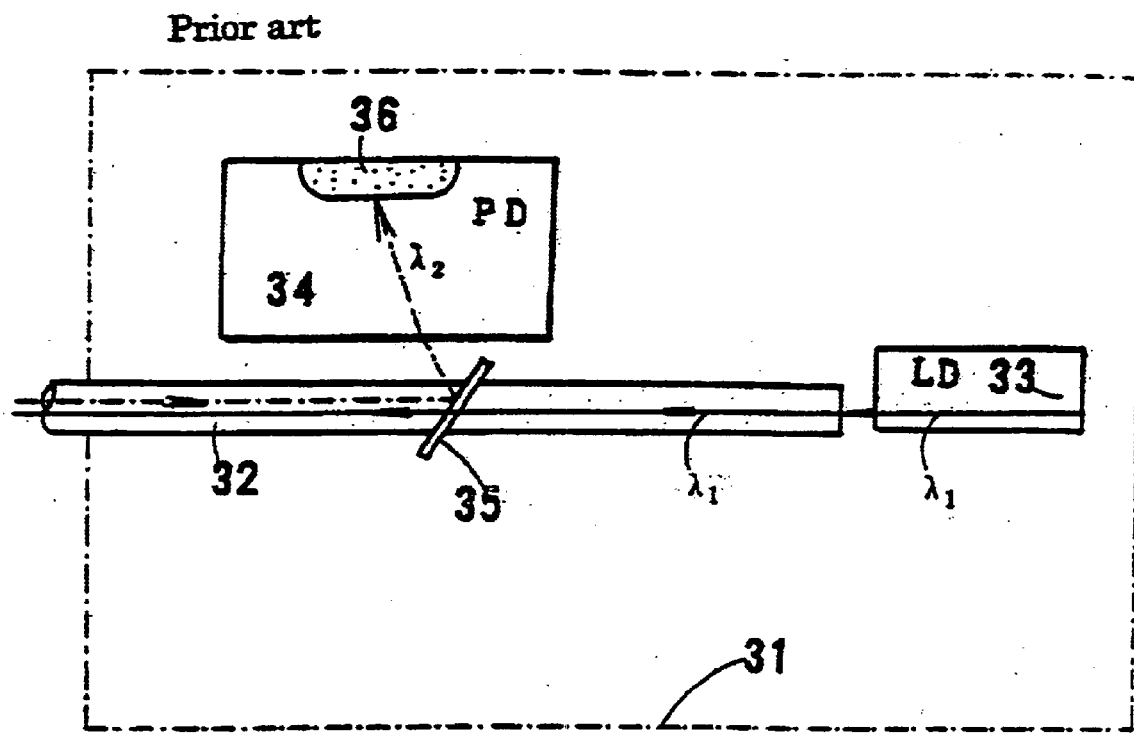
FIG. 6 is a schematic diagram showing the constitution of a conventional optical transceiver module at a subscriber that has an LD for generating outgoing going light (wavelength: λ1) and a PD for receiving incoming light (wavelength: λ2) (λ1<λ2)
Figure 7:
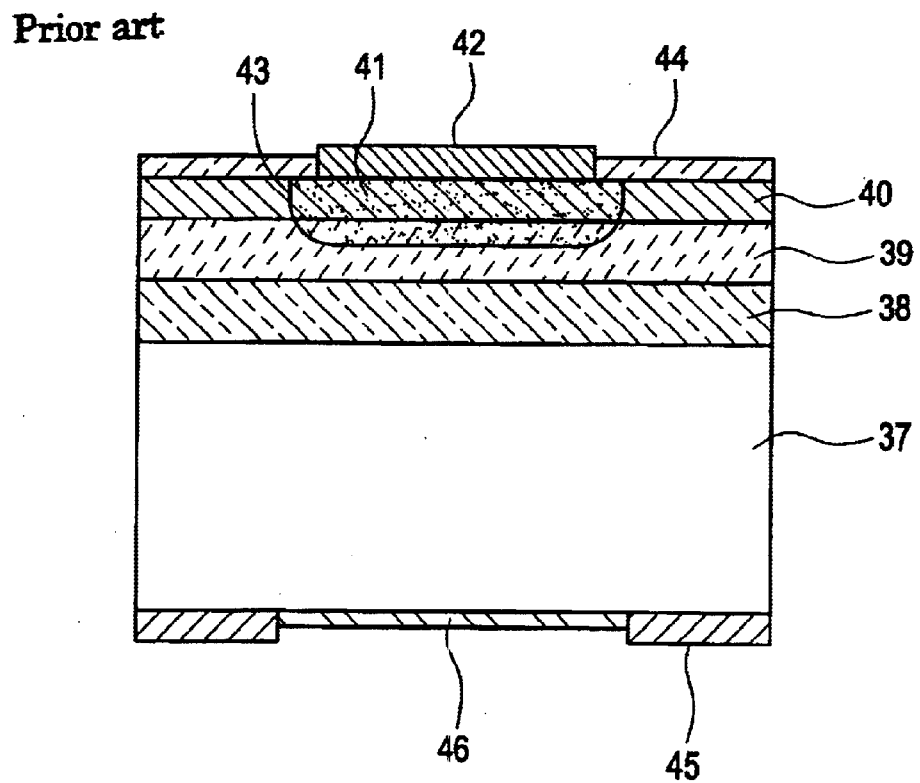
FIG. 7 is a cross-sectional view of a conventional PD having an InGaAs absorption layer having sensitivity in a wide range including λ1 and λ2.
Figure 8:
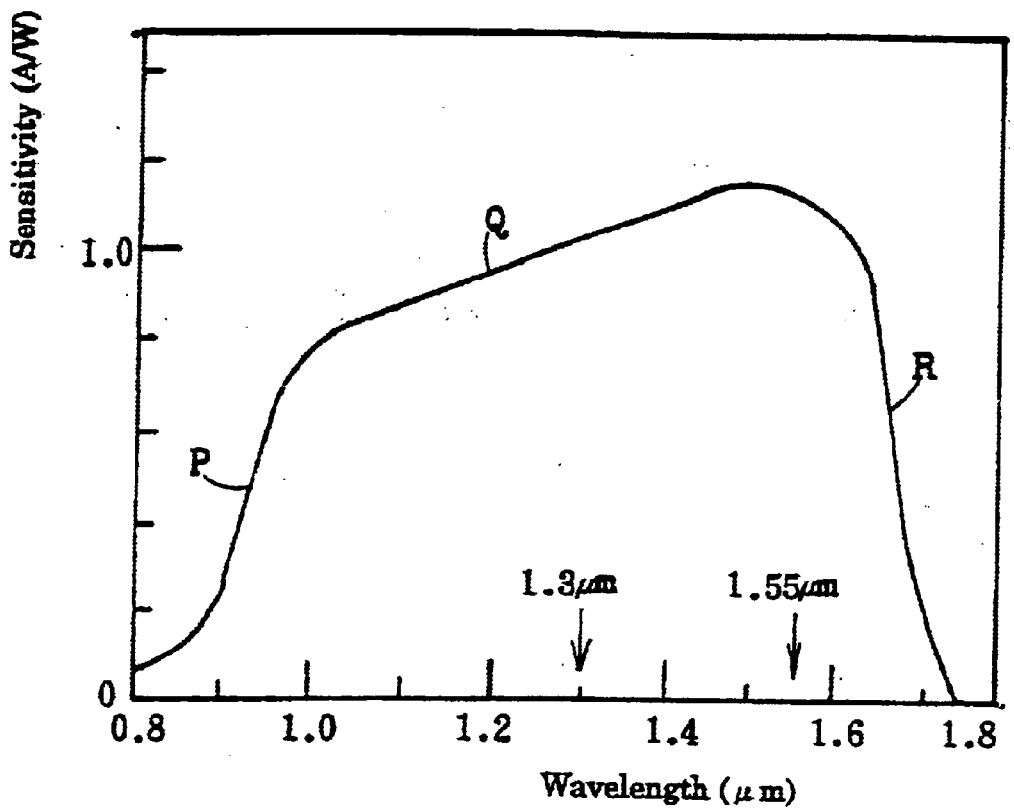
FIG. 8 is a graph showing the sensitivity-wavelength characteristic of a conventional PD, in which the axis of abscissa represents wavelength ($\mu$m) and the axis of ordinate represents sensitivity (A/W)
Figure 9:
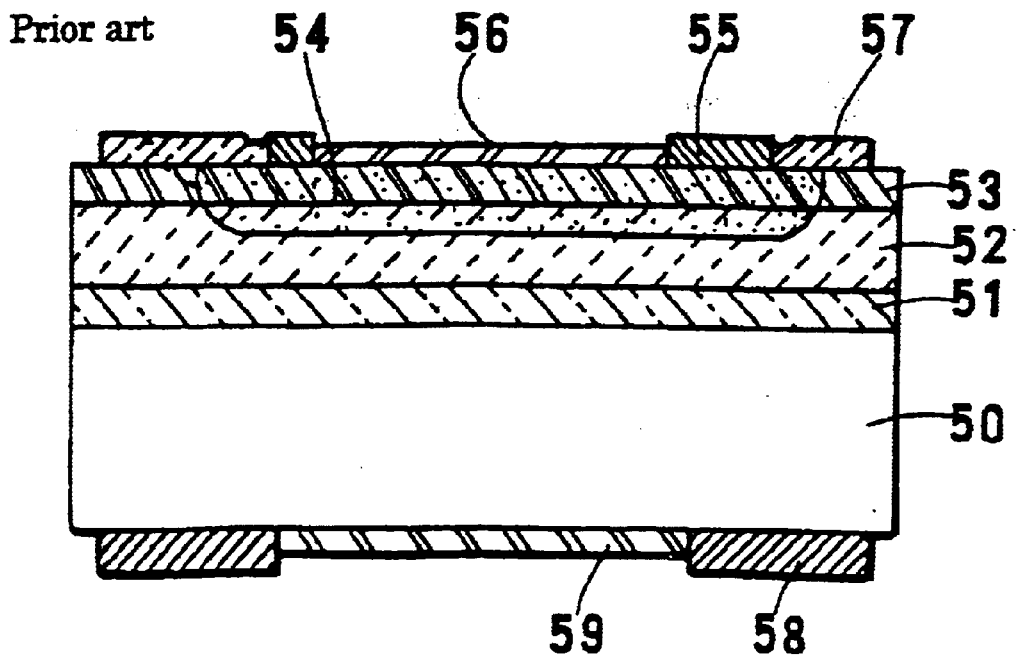
FIG. 9 is a cross-sectional view of the 1.3-$\mu$m-light-detecting PD in the combination of a 1.3-$\mu$m-light-detecting PD and a 1.55-$\mu$m-light-detecting PD that is disclosed in the published Japanese patent application Tokukaihei 9-166717.
Figure 10:
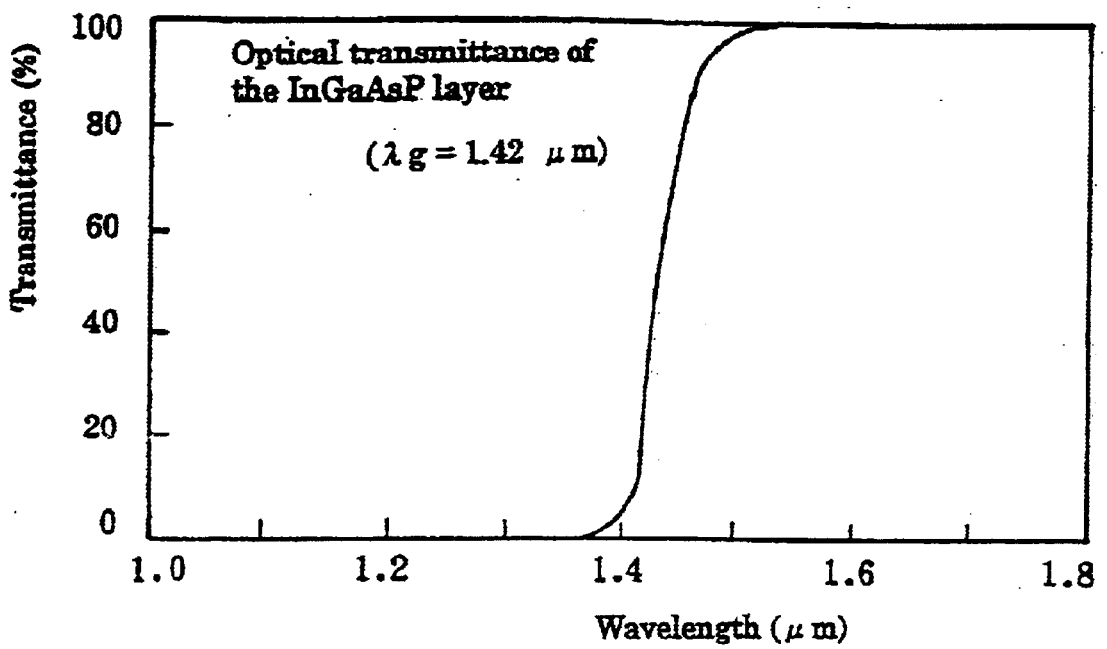
FIG. 10 is a graph showing the light transmittance-wavelength characteristic of the InGaAsP layer of the PD shown in FIG. 9, in which the axis of abscissa represents wavelength ($\mu$m) and the axis of ordinate represents transmittance (%)
Figure 11:
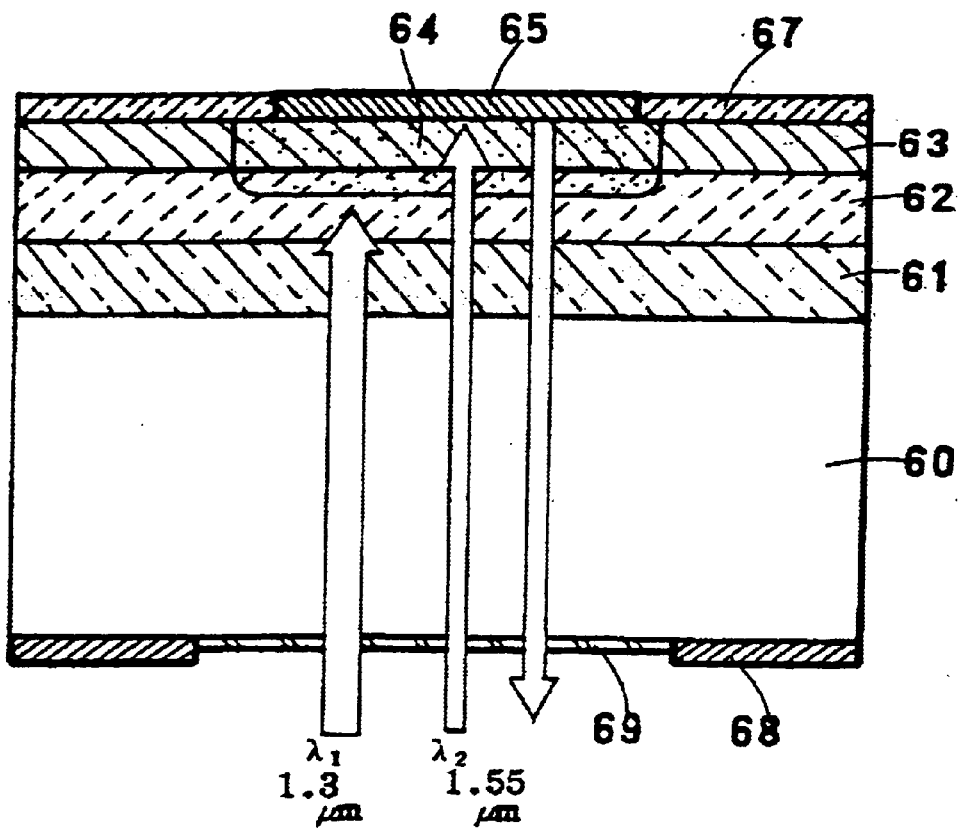
FIG. 11 is a cross-sectional view of a 1.3-$\mu$m-light-detecting PD produced by closing the front-side opening of the 1.3-$\mu$m-light-detecting PD shown in FIG. 9 by the p electrode.

The PD for 1.3-$\mu$m light shown in FIG. 9 detects 0.1% of 1.55-$\mu$m light. However, the PD for 1.3-$\mu$m light produced for central-office use shown in FIG. 11 has a higher sensitivity to 1.55-$\mu$m light; it detects 0.2% of 1.55-$\mu$m light. Although the two PDs have the same absorption-layer thickness, 5 $\mu$m, the effects differ by a factor of two. The study on the difference revealed that the sensitivity increase is caused by the phenomenon that the 1.55-$\mu$m light is reflected by the p electrode 65, which covers the entire p-type region, and passes through the absorption layer once more. In FIG. 11, the thicker arrow represents the light (λ1=1.3 $\mu$m) to be detected. This light is absorbed by the InGaAsP absorption layer 62, generates an optical current in proportion to its intensity, and disappears. This function is in accordance with the design concept and poses no problem. At a central office, however, when the intense outgoing going 1.55-$\mu$m light enters at the back side, it passes through the InGaAsP absorption layer 62 upward from under, generating a slight optical current. This does not terminate the action of the light. It is reflected by the under side of the p electrode 65 and passes through the absorption layer 62 once more in the opposite direction, generating optical current again. As a result, crosstalk occurs twice. This is the reason why the PD shown in FIG. 9 has a sensitivity of 0.1% to 1.55-$\mu$m light and the PD shown in FIG. 11 has a sensitivity two times as much, 0.2%.

The present invention intends to reduce the crosstalk caused by 1.55-$\mu$m light by preventing or impeding the return of the 1.55-$\mu$m light to the absorption layer after passing through the absorption layer once. In order to achieve this purpose, a layer (filter layer) for absorbing 1.55-$\mu$m light is additionally provided at the inside or outside of the PD structure. Since these filter layers absorb unwanted 1.55-$\mu$m light, the light does not return to the absorption layer for 1.3-$\mu$m light, or its strength is notably reduced even if it returns. This measure can effectively reduce the crosstalk to the 1.3-$\mu$m light by the 1.55-$\mu$m light predominant at a central office. The present invention provides a material that absorbs light having λ2 on the p-type region. The providing methods are classified into four groups, which are explained below, according to their differences.

Type 1: Thick Cap Layer (FIG. 12)

Figure 12:
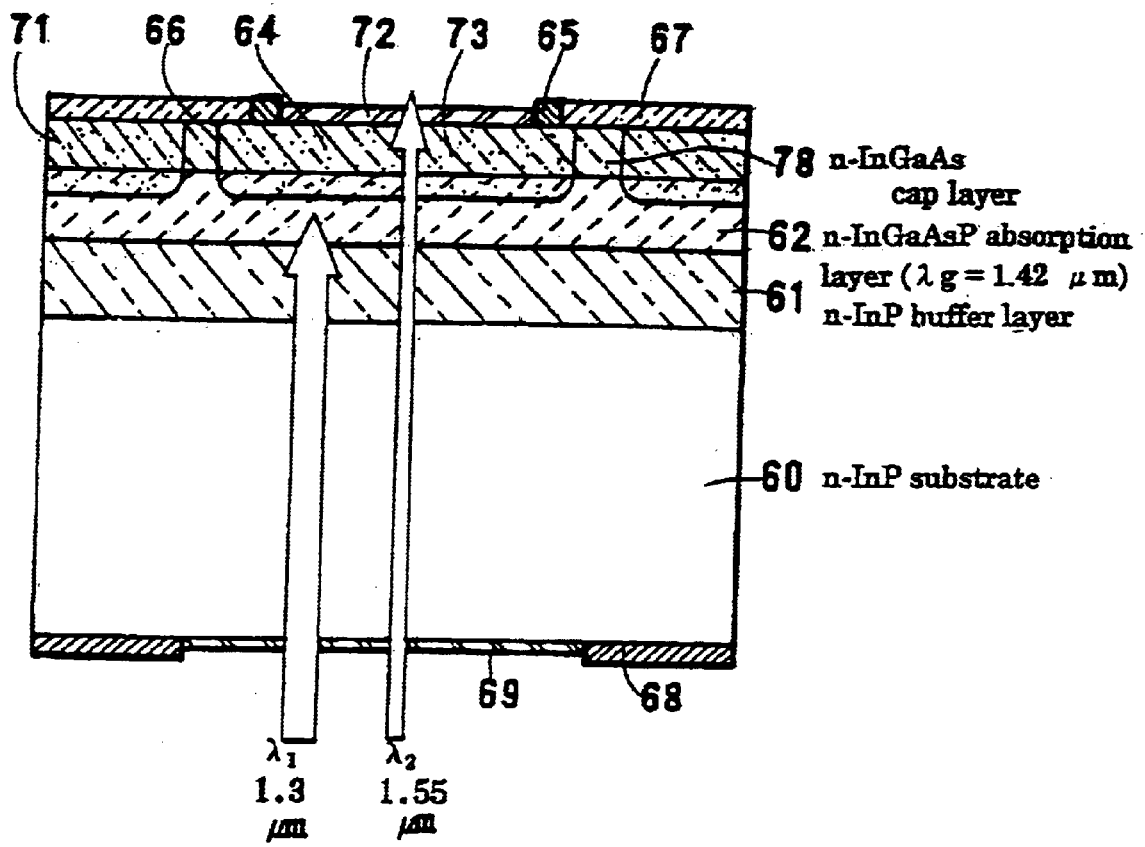
FIG. 12 is a cross-sectional view of a PD for detecting light having λ1 (λ1<λ2) of Type 1 of the present invention, in which an InGaAs cap layer that can absorb light having λ2 is provided on the entire absorption layer.

FIG. 12 shows an embodiment of the present invention in which a thick InGaAs cap layer (filter layer) is provided on the absorption layer. An n-InP buffer layer 61, an n-InGaAsP absorption layer 62 (λg=1.42 $\mu$m), and an n-InGaAs cap layer (filter layer) 78 are grown epitaxially on an n-InP substrate 60. At the center portion of the chip, Zn is diffused to provide a p-type region 64. Another p-type region is formed at the periphery of the chip at the same time. This additional p-type region is referred to as a Zn-diffused shield layer 71. A ring-shaped p electrode 65 is provided on the p-type region 64. Directly under the ring-shaped p electrode 65, there lies a portion in which the n-InGaAs cap layer 78 is converted into the p-type region. Since the p electrode has an opening at its inside, it is called a ring-shaped electrode. The p electrode 65 can have any inside and outside shapes, such as a circle, oval, square, pentagon, or hexagon (this is to be applied also to Types 2 to 4).

An InP layer is used usually as the cap layer on the absorption layer. However, InP cannot absorb light having λ2 because it has a wide bandgap. Consequently, Type 1 employs InGaAs in place of InP as the cap layer so that the layer itself can absorb light having λ2. Because InGaAs has a narrow bandgap, it can absorb light having λ2. Therefore, the cap layer can also be called a filter layer.

An anti-reflection layer 72 is formed on the p-type region 64 at the inside of the p electrode 65. Since the PD is a back-illuminated type, the anti-reflection layer 72 is not for admitting light, but for allowing the unwanted light having λ2 to leave the PD without being reflected. At the outside of the p electrode 65, a passivation layer 67 is formed to protect the edge of a pn junction 66. Since light enters the PD at the back side, the back-side structure is the same as in FIG. 9. A ring-shaped n electrode 68 is formed on the bottom surface of the InP substrate 60. The inside of the n electrode 68 forms an opening and is covered by an anti-reflection layer 69. As with the p electrode 65, the n electrode 68 can have any inside and outside shapes, such as a circle, oval, square, or octagon (this is to be applied also to Types 2 to 4). Table I shows the thickness and carrier concentration of the epitaxial layers.

TABLE I

| Layer's name | Layer's thickness (μm) | Carrier concentration (cm$^{-3}$) |
|---|---|---|
| InGaAs cap layer (filter layer) (78) | 5 | p = $10^{18}$ |
| InGaAsP absorption layer (62) | 5 | n = $10^{15}$ |
| InP buffer layer (61) | 4 | n = $10^{15}$ |
| InP substrate (60) | 200 | n = $10^{18}$ |

The p-InGaAs cap layer is produced by converting the n-InGaAs cap layer 78 into a p type by the diffusion of Zn. The layer is as thick as 5 μm in order to absorb and attenuate light having λ2. The unwanted light having λ2 passes through the absorption layer upward from under. It is absorbed by the cap layer 78, and the remaining light leaves the PD. Dissimilar to the PD in FIG. 11, the light having λ2 is not reflected by the p electrode, so that it does not return to the absorption layer. The anti-reflection layer 72 provided at the top surface is for preventing the reflection of the light having λ2=1.55 μm when it leaves the PD, not for preventing the reflection of light incident from outside. When stray light having λ2 enters the PD from above, the InGaAs cap layer can prevent the influence of the light. Because the layer has high hole concentration, the hole-electron pairs produced by the absorption of the light having λ2 recombine without generating optical current. In short, Type 1 replaces the InP window layer in the internal structure of a conventional PD by a thick InGaAs cap layer for the purpose of absorbing light having λ2 so that it cannot return to the absorption layer.

Type 2: Local and Thick Filter Layer (FIG. 13)

Figure 13:
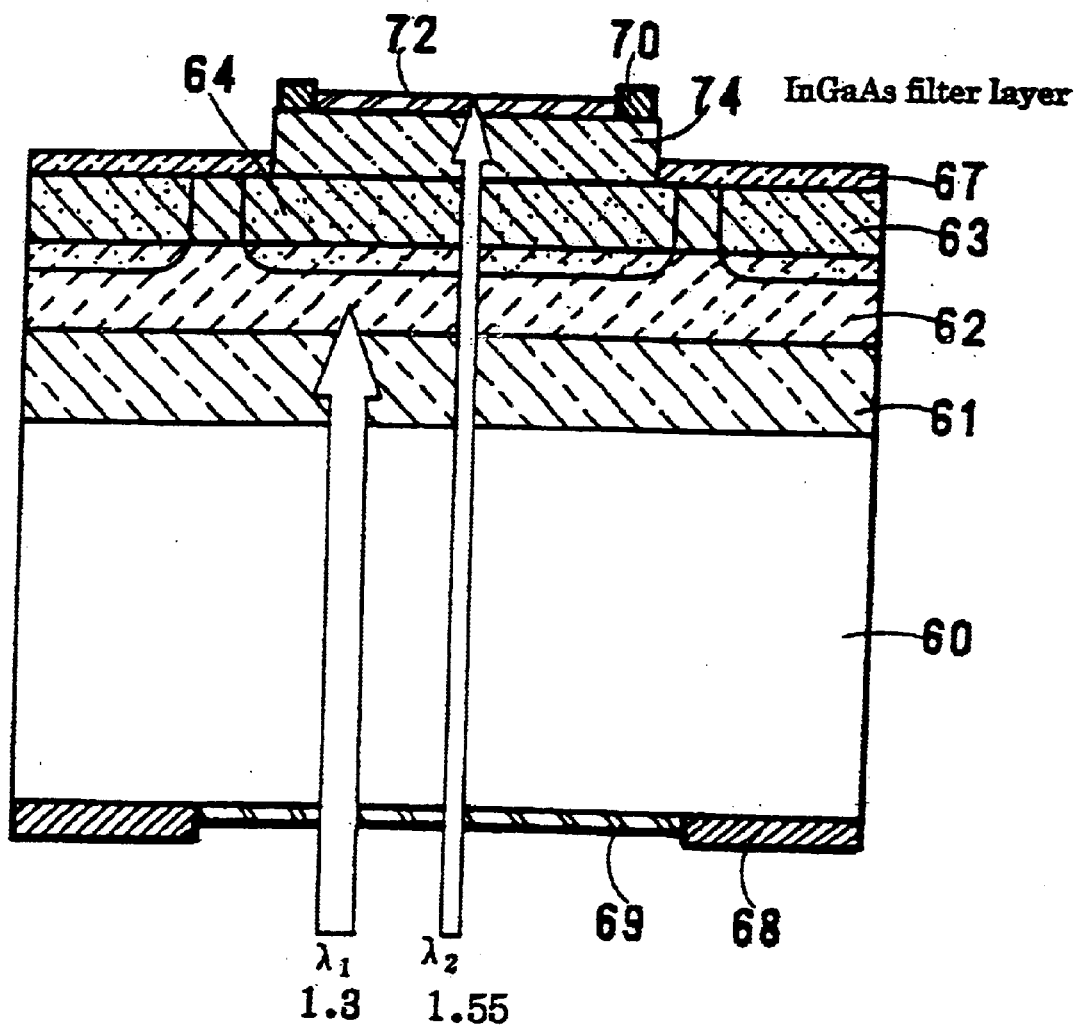
FIG. 13 is a cross-sectional view of a PD for detecting light having λ1 (λ1<λ2) of Type 2 of the present invention, in which an InGaAs filter layer that can absorb light having λ2 is provided only on the center portion of the cap layer.

FIG. 13 shows another embodiment of the present invention in which a thick InGaAs filter layer is provided only at the center portion of a chip. Whereas Type 1 shown in FIG. 12 has a uniformly thick InGaAsP cap layer, Type 2 is designed with the concept that the light having λ2 passing through the center portion of the chip can be handled with a thick filter layer provided only at the center portion. Consequently, the cap layer is made of InP.

An n-InP buffer layer 61, an n-InGaAsP absorption layer 62 (λg=1.42 μm), an n-InP cap layer 63, and an InGaAs filter layer 74 are grown epitaxially on an n-InP substrate 60. At the center portion of the chip, Zn is diffused to provide a p-type region 64. Another p-type region is formed at the periphery of the chip at the same time. This additional p-type region is a Zn-diffused shield layer. The peripheral portion of the InGaAs filter layer 74 is removed so that the center portion, which is converted into a p-type region, can be remained. A ring-shaped p electrode 70 is provided on the protruding portion at the center. An anti-reflection layer 72 is formed on the InGaAs filter layer 74 at the inside of the p electrode 70. Since the PD is a back-illuminated type, the anti-reflection layer 72 is not for admitting light, but for allowing the unwanted light having λ2 to leave the PD without being reflected.

Directly under the ring-shaped p electrode 70, there lies the p-InGaAs filter layer 74, followed by the p-InP cap layer and the p-InGaAsP absorption layer Usually, an InP cap layer is placed on the absorption layer. However, InP has a wide bandgap and cannot absorb light having λ2. Consequently, Type 2 further laminates an InGaAs layer, which can absorb light having λ2, on the InP cap layer. Dissimilar to Type 1, this type absorbs light having λ2 by the thick InGaAs filter layer provided only at the center portion.

At the outside of the InGaAs filter layer 74, a passivation layer 67 is provided to protect the edge of the pn junction. Since light enters the PD at the back side, the back-side structure is the same as in FIG. 12. A ring-shaped n electrode 68 is formed on the bottom surface of the n-InP substrate 60. The inside of the n electrode 68 forms an opening and is covered by an anti-reflection layer 69. The p-InGaAs filter layer 74 has a thickness of 5 μm and a carrier concentration of p=$10^{18}$cm$^{-3}$. The layer is as thick as 5 μm in order to absorb and attenuate light having λ2. The unwanted light having λ2 passes through the absorption layer upward from under. It is absorbed by the filter layer, and the remaining light leaves the PD. Dissimilar to the PD in FIG. 11, the light having λ2 is not reflected by the p electrode, so that it does not return to the absorption layer.

The anti-reflection layer 72 provided at the top surface is for preventing the reflection of the light having λ2=1.55 μm when it leaves the PD, not for preventing the reflection of light incident from outside. When stray light having λ2 enters the PD from above, the InGaAs filter layer 74 can prevent the influence of the light. Because the layer has high hole concentration, the hole-electron pairs produced by the absorption of the light having λ2 recombine without generating optical current. In short, Type 2 additionally provides a thick InGaAs filter layer for absorbing light having λ2 so that it cannot return to the absorption layer.

Type 3: Selectively Grown Thick Filter Layer (FIG. 14)

Figure 14:
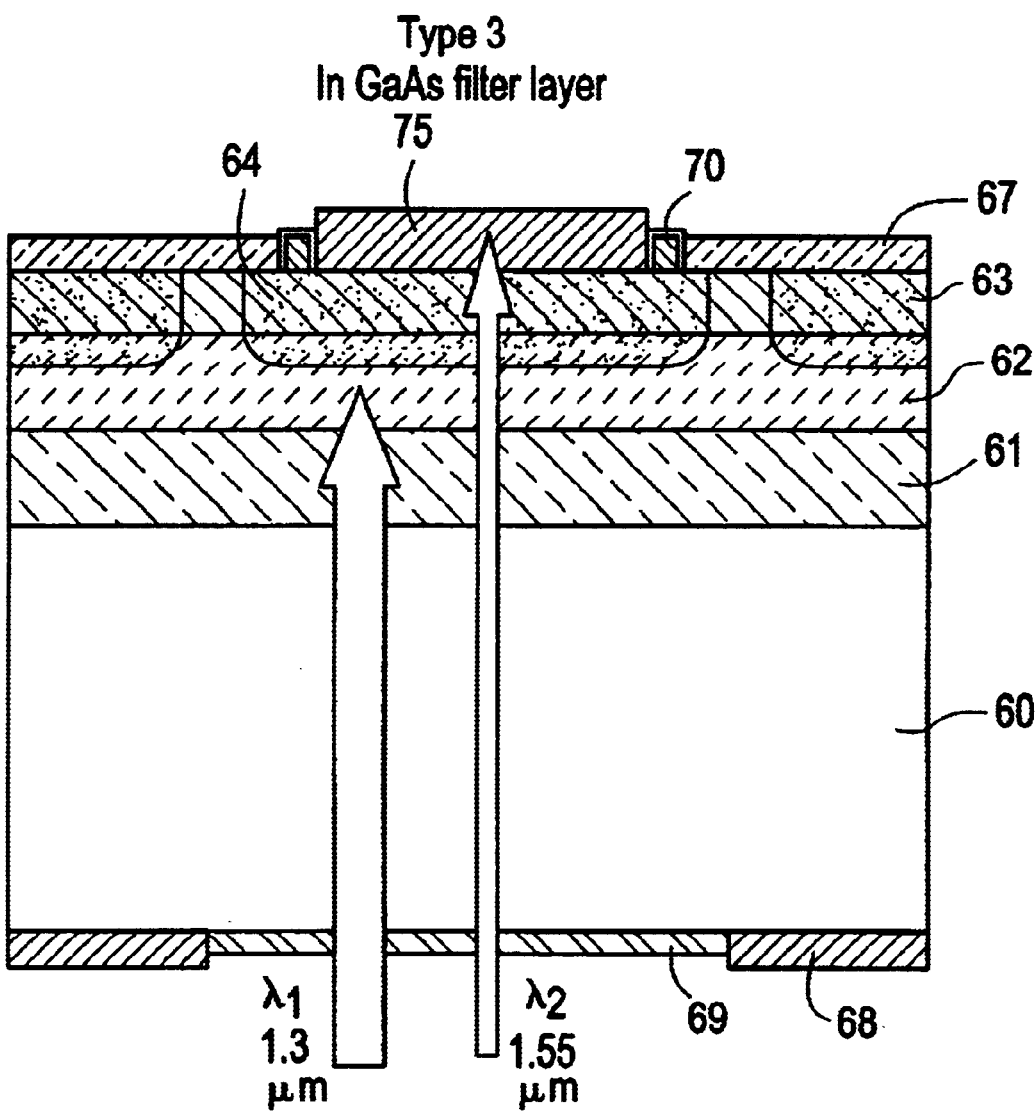
FIG. 14 is a cross-sectional view of a PD for detecting light having λ1 (λ1<λ2) of Type 3 of the present invention, in which an InGaAs filter layer that can absorb light having λ2 is selectively grown at the inside of the p electrode.

FIG. 14 shows yet another embodiment of the present invention in which a thick filter layer is provided at the center portion of a chip. In Type 2 shown in FIG. 13, the layers up to and including the filter layer are formed by the epitaxial growth method. Type 3, however, uses an ordinary epitaxial wafer in which the layers up to and including an n-InP cap layer are grown. An InGaAs filter layer at the center portion is selectively grown by utilizing the electrode structure after the formation of the pn junction.

An n-InP buffer layer 61, an n-InGaAsP absorption layer 62 (λg=1.42 μm), and an n-InP cap layer 63 are grown epitaxially on an n-InP substrate 60. At the center portion of the chip, Zn is diffused to provide a p-type region 64. Another p-type region is formed at the periphery of the chip at the same time. This additional p-type region is a Zn-diffused shield layer. A ring-shaped p electrode 70 is provided on the p-type region 64. At the outside of the ring-shaped p electrode 70, a passivation layer 67 is provided to protect the pn junction.

An InGaAs filter layer 75 that absorbs light having $\lambda 2$ is selectively grown on the center portion of the chip's top surface that is surrounded by the ring-shaped p electrode 70. The filter layer can be epitaxially grown by a method such as molecular-beam epitaxy (MBE), metalorganic chemical vapor deposition (MOCVD), etc. Because InGaAs cannot grow on the passivation layer and the metal electrode, it selectively grows only on the InP cap layer. Since the p electrode lies outside the periphery of the InGaAs filter layer 75, no electric field exists in the InGaAs.

A ring-shaped n electrode 68 and an anti-reflection layer 69 are formed on the bottom surface. Incoming light ($\lambda 1=1.3$ $\mu$m) and outgoing light ($\lambda 2=1.55$ $\mu$m) enter at the back side. The light having $\lambda 1$ is absorbed by the absorption layer 62 and detected by generating optical current. The light having $\lambda 2$ passes through the absorption layer upward after being absorbed slightly by the absorption layer. The light having $\lambda 2$ is absorbed mainly by the InGaAs filter layer 75. Even if a slight amount of the light having $\lambda 2$ leaves the PD, the amount of the light reflected somewhere at the outside further decreases. Virtually no light having $\lambda 2$ returns to the absorption layer 62. The light having $\lambda 2$ passes through the absorption layer only once. Therefore, the crosstalk caused by the returning light having $\lambda 2$ can be prevented effectively.

Figure 15:
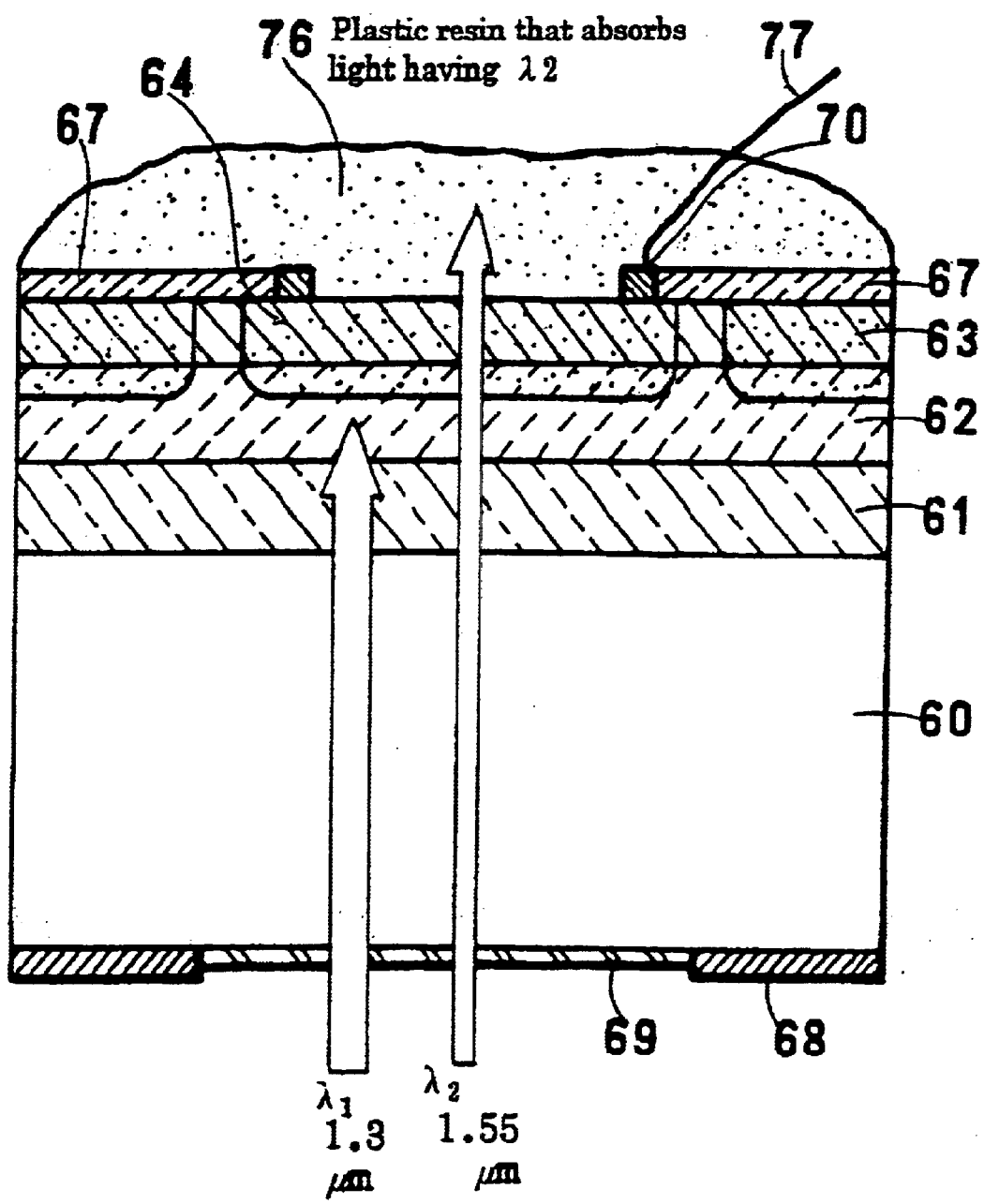
FIG. 15 is a cross-sectional view of a PD for detecting light having λ1 (λ1<λ2) of Type 4 of the present invention, in which a plastic resin that can absorb light having λ2 is applied to the entire top surface of the chip.

Type 4: Chip Whose Entire Top Surface is Covered by Plastic (FIG. 15)

Types 1 to 3 absorb light having $\lambda 2$ by the semiconductor material InGaAs. However, the light can be absorbed also by plastic. FIG. 15 shows such an embodiment. An n-InP buffer layer 61, an n-InGaAsP absorption layer 62 ($\lambda g=1.42$ $\mu$m), and an n-InP cap layer 63 are grown epitaxially on an n-InP substrate 60. Table II shows the thickness and carrier concentration of the epitaxial layers.

TABLE II

| Layer's name | Layer's thickness ($\mu$m) | Carrier concentration (cm$^{-3}$) |
|---|---|---|
| InP cap layer (63) | 3 | n = 5 × 10$^{15}$ |
| InGaAsP absorption layer (62) | 5 | n = 10$^{15}$ |
| InP buffer layer (61) | 4 | n = 10$^{15}$ |
| InP substrate (60) | 200 | n = 10$^{18}$ |

At the center portion of the chip, Zn is diffused to provide a p-type region 64. Another p-type region is formed at the periphery of the chip at the same time. This additional p-type region is a Zn-diffused shield layer A ring-shaped p electrode 70 is provided on the p-type region 64. At the outside of the ring-shaped p electrode 70, a passivation layer 67 is provided to protect the pn junction. No anti-reflection layer is provided at the inside of the p electrode 70. A ring-shaped n electrode 68 and an anti-reflection layer 69 are formed on the bottom surface. They are produced through the wafer process. After a chip is cut out from the wafer and mounted on a package, the p electrode 70 is connected to a lead pin with a lead wire 77. Then, a plastic resin 76 that absorbs light having $\lambda 2$ is applied to the entire top surface of the chip. The plastic resin is required to absorb light having $\lambda 2$; it is not required to absorb the light exclusively. Therefore, the plastic resin can be black.

Incoming light ($\lambda 1=1.3$ $\mu$m) and outgoing light ($\lambda 2=1.55$ $\mu$m) enter at the back side. The light having $\lambda 1$ is absorbed by the absorption layer and detected by generating optical current. The light having $\lambda 2$ passes through the absorption layer upward after being absorbed slightly by the absorption layer. Then, the light leaves the cap layer and is absorbed by the plastic resin 76. Only a slight amount of the light having $\lambda 2$ leaves the PD. Even if the light is reflected at the case and parts, it does not return to the absorption layer. As with Types 1 to 3, the light having $\lambda 2$ passes through the absorption layer only once. Therefore, the crosstalk caused by the returning light having $\lambda 2$ can be prevented effectively. Type 4 requires no extra epitaxial growth. Type 4 accomplishes its purpose by applying the plastic resin after the chip is mounted on a package. As a result, Type 4 can be employed easily in practical application.

EXAMPLES

Figure 16:
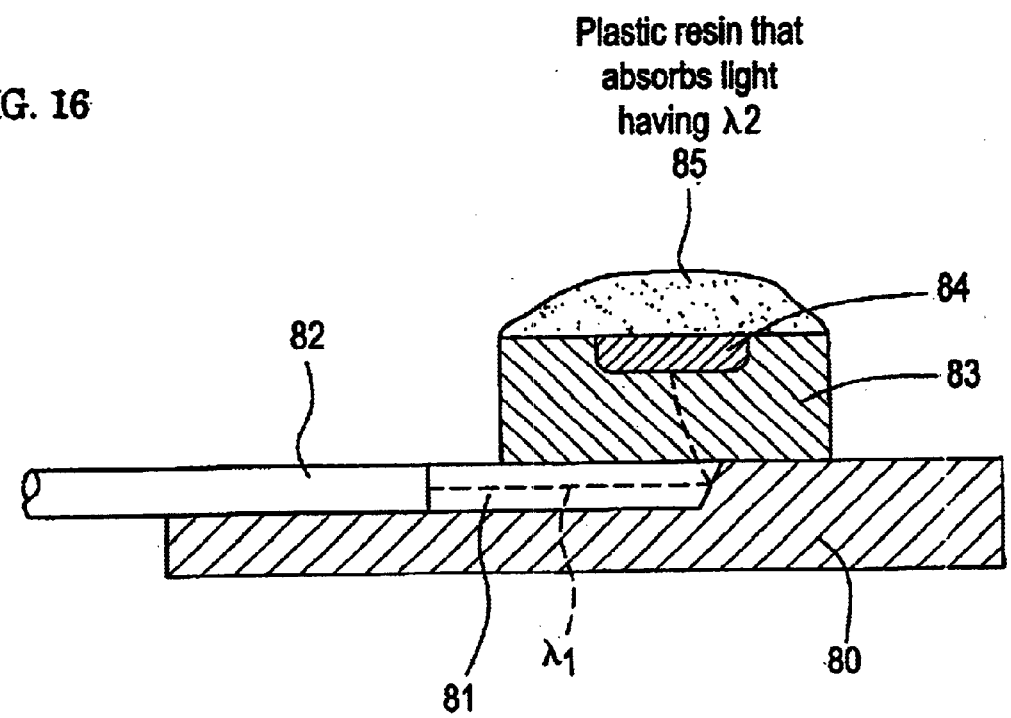
FIG. 16 is a cross-sectional view of an example in which the Type 4 PD of the present invention is used for a surface-mounted-type PD module at a central office.

FIG. 16 shows a surface-mounted-type PD module on which a Type 4 PD is mounted. A V-shaped groove 81 is provided longitudinally on the surface of an Si platform 80. A mirror face is provided at the end of the V-shaped groove. An optical fiber 82 is inserted into the V-shaped groove 81 and fixed there. A back-illuminated-type PD 83 of the present invention is fixed on the V-shaped groove 81. Although it is a back-illuminated type, the PD has an opening at the top surface through which light can pass. The top surface is covered by a plastic resin 85 that absorbs light having $\lambda 2$.

At a central office, the incoming light having $\lambda 1$ emerges from the optical fiber 82, enters the V-shaped groove 81, is reflected at the mirror face, and enters the PD 83 at the back side. The light reaches an absorption layer 84, generates optical current, and is detected by the PD. When the stray light and scattered light produced by the intense outgoing light having $\lambda 2$ enter the PD from the V-shaped groove, the absorption layer scarcely detects them. After passing through the absorption layer upward, they do not return to the absorption layer. There also exists stray light having $\lambda 2$ above the PD. However, since it is absorbed by a plastic resin 85, it does not enter the absorption layer of the PD. Consequently, light having $\lambda 2$ passes through the absorption layer only once. Therefore, crosstalk caused by the light having $\lambda 2$ can be suppressed to 0.1% or less. The plastic resin can be applied to the PD at the stage of the chip mounting, without increasing the wafer process.

Figure 17:
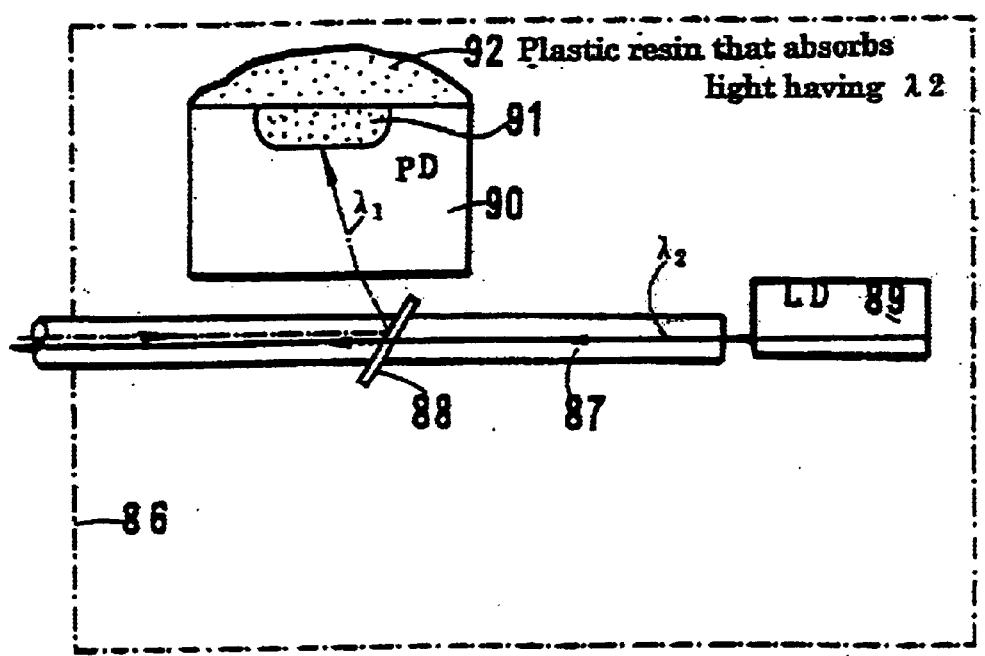
FIG. 17 is a cross-sectional view of an example in which the Type 4 PD of the present invention is used for a surface-mounted-type transceiver module at a central office.

FIG. 17 shows a schematic- cross-sectional view of a surface-mounted-type optical transceiver module that uses a Type 4 PD. The transceiver module is constructed on an Si platform, which is not shown in FIG. 17, in a housing 86. An optical fiber 87 is attached to the Si platform. An LD 89 for generating outgoing going light having $\lambda 2$ at a central office is mounted opposite to the end of the optical fiber. A WDM filter 88 is provided on the skew at some point in the optical fiber near its end. A back-illuminated-type PD 90 of the present invention is placed obliquely above the WDM filter. The PD 90 is a Type 4 PD, which has on the top surface a plastic resin 92 that can absorb light having $\lambda 2$.

A signal carried by the outgoing light ($\lambda 2=1.55$ $\mu$m) emitted from the LD 89 enters the optical fiber 87 to be transmitted to a subscriber The incoming light ($\lambda 1=1.3$ $\mu$m) carrying a signal from the subscriber propagates through the optical fiber 87, is reflected by the WDM filter 88, enters the PD 90 at the back side, and is absorbed by an absorption layer 91, generating optical current. The intense outgoing light having $\lambda 2$ generated by the LD 89 produces stray light and scattered light, which surround the PD. The light having $\lambda 2$ which enters the PD at the back side passes through the absorption layer once, generating optical current sightly. However, the light having λ2 which enters the plastic resin 92 at the top surface is absorbed by the plastic resin, without penetrating into the PD. Therefore, the module can minimize the influence of the outgoing light at a central office.

INDUSTRIAL APPLICABILITY

A central office receives light having a shorter wavelength (λ1=1.3 μm) and transmits light having a longer wavelength (λ2=1.55 μm). When the bandgap wavelength of a semiconductor is represented by λg, the light having λ2, which is longer than λg, was thought to pass through the semiconductor without causing any influence. Therefore, the phenomenon that the light having λ2 causes crosstalk to the light having λ1 was not known to a person skilled in the art. There was no concept that light having a longer wavelength causes crosstalk, to a PD for a shorter wavelength. In other words, the present inventors first found the necessity of reducing the above-mentioned crosstalk.

The present inventors first found that contrary to the conventional knowledge, the absorption layer of a PD for a shorter wavelength, λ1, slightly detects a longer wavelength, λ2. The present invention admits that in a back-illuminated-type PD for λ1, light having λ2 passes through the absorption layer once. The present invention, however, prevents the light from passing through the layer again after being reflected The first passage generates a crosstalk of 0.1%; the second passage increases it to 0.2%. The present invention prevents this increase and thereby enables the reduction of the crosstalk hitherto unknown to a person skilled in the art.

What is claimed is:

1. A back-illuminated-type photodiode that concurrently admits light having a longer wavelength, λ2, and light having a shorter wavelength, λ1, and that detects only the light having a shorter wavelength, λ1, which photodiode comprising:

(a) a semiconductor substrate;
(b) an absorption layer being:
   (b1) placed on the semiconductor substrate;
   (b2) provided with a pn junction in the layer; and
   (b3) made of a semiconductor material having a bandgap wavelength, λg, longer than λ1 and shorter than λ2;
(c) a cap layer placed in contact with the absorption layer;
(d) a filter layer being:
   (d1) placed in contact with the center portion of the cap layer; and
   (d2) made of a material that absorbs light having the wavelength λ2;
(e) a first electrode being:
   (e1) placed on the bottom surface of the semiconductor substrate; and
   (e2) provided with an opening for admitting light; and
(f) a second electrode placed at the outside of the filter layer, thereby forming an opening for allowing light to leave the photodiode,
   in which the absorption layer comprises InGaAsP having a bandgap wavelength not less than 1.3 μm and not more than 1.5 μm, and
   in which a buffer layer comprising InP is provided between the substrate and the absorption layer.

2. A photodiode as defined in claim 1 in which:
(a) the wavelength λ1 is not less than 1.2 μm and not more than 1.38 μm; and
(b) the wavelength λ2 is not less than 1.45 μm and not more than 1.65 μm.

3. A photodiode as defined in claim 1 in which an anti-reflection layer is provided at the opening of the first electrode.

* * * * *